United States Patent

Sahara

[11] Patent Number: 5,940,423
[45] Date of Patent: Aug. 17, 1999

[54] SEMICONDUCTOR LASER, OPTICAL PICKUP DEVICE, AND OPTICAL RECORD AND/OR REPRODUCING APPARATUS

[75] Inventor: Kenji Sahara, Kanagawa, Japan

[73] Assignee: Sony Corporation, Tokyo, Japan

[21] Appl. No.: 08/873,106

[22] Filed: Jun. 11, 1997

[30] Foreign Application Priority Data

Jun. 14, 1996 [JP] Japan ..................................... 8-175560

[51] Int. Cl.⁶ ....................................................... H01S 3/19
[52] U.S. Cl. ............................................. 372/46; 372/45
[58] Field of Search .................................. 372/46, 45, 50

[56] References Cited

U.S. PATENT DOCUMENTS 4,509,173  4/1985  Umeda et al. ............................. 372/50

Primary Examiner—Rodney Bovernick
Assistant Examiner—Quyen Phan Leung
Attorney, Agent, or Firm—Hill & Simpson

[57] ABSTRACT

A semiconductor laser comprises: a substrate, a first cladding layer on the substrate, an active layer on the first cladding layer, a second cladding layer on the active layer; and the second cladding layer has a plurality of steps of equivalent complex index of refraction disposed to be parallel to p-n junction direction and to be perpendicular to a cavity direction. In an optical pickup device using a semiconductor laser as a light source thereof, the semiconductor laser comprises: a substrate, a first cladding layer on the substrate, an active layer on the first cladding layer, a second cladding layer on the active layer; and the second cladding layer has a plurality of equivalent complex index of refraction disposed to be parallel to p-n junction direction and to be perpendicular to a cavity direction. In an optical record and/or reproducing apparatus using semiconductor laser as a light source thereof, the semiconductor laser comprises: a substrate, a first cladding layer on the substrate, an active layer on the first cladding layer, a second cladding layer on the active layer; and the second cladding layer has a plurality of steps of equivalent complex index of refraction disposed to be parallel to p-n junction direction and to be perpendicular to a cavity direction.

7 Claims, 6 Drawing Sheets

SEMICONDUCTOR LASER, OPTICAL PICKUP DEVICE, AND OPTICAL RECORD AND/OR REPRODUCING APPARATUS

BACKGROUND OF THE INVENTION

1. Field of the Invention

This invention relates to a semiconductor laser, and an optical pickup device and an optical record and/or reproducing apparatus using the semiconductor laser.

2. Description of the Related Art

FIGS. 1A and 1B show a conventional real index-guide semiconductor laser. FIG. 1A is a schematic view showing of the conventional real index-guide semiconductor laser, and FIG. 1B is a schematic view showing distribution of refractive index corresponding to FIG. 1A.

As shown in FIG. 1A, the conventional real index-guide semiconductor laser includes an n-type cladding layer 101, active layer 102 and p-type cladding layer 103 on a semiconductor substrate (not shown). An upper-layer portion of the p-type cladding layer 103 has the form of a stripe extending in one direction and having a given width. The extending direction of the stripe portion 103a corresponds to the cavity-lengthwise direction of the real index-guide semiconductor laser. Formed in opposite sides of the stripe portion 103a are low-index regions 104 having a lower refractive index than that of the p-type cladding layer 103.

FIG. 1B shows distribution of equivalent refractive indices of the conventional real index-guide semiconductor laser. As shown in FIG. 1B, the conventional real index-guide semiconductor laser has a stepped distribution of refractive indices where the refractive index is higher at a portion aligned with the stripe portion 103a and lower at portions aligned with the low index regions 104 in opposite sides of the stripe portion 103a. That is, it has one equivalent index step in the direction parallel to the p-n junction and perpendicular to the cavity-lengthwise direction. In this manner, stabilization of the transverse basic mode of laser oscillation is intended.

In the conventional real index-guide semiconductor laser, the stripe portion 103a of the upper-layer portion of the p-type cladding layer 103 is made by first growing the p-type cladding layer 103 on the entire surface and thereafter etching the p-type cladding layer 103 by wet etching. However, due to an unsatisfactory controllability of the etching rate during the etching process, the stripe portion 103 results in variance in width (stripe width). More specifically, the variance amounts to ±0.3 µm or more. This results in a variance as large as ±2° or more in horizontal radiation angle θ// of laser light depending on the stripe width.

Another problem occurs when the conventional real index-guide semiconductor laser is used as a light source of an optical pickup device or an optical record and/or reproducing device. That is, when the horizontal radiation angle θ// of laser light exceeds the lower limit, the amount of peripheral light of the lens decreases, and the light spot is expanded on the surface of an optical disc. When, in contrast, the horizontal radiation angle θ// of laser light exceeds the upper limit, the semiconductor laser needs a larger power for emission of light during recording on the optical disc, and may cause undesirable evaluation to the reliability of the semiconductor laser.

OBJECTS AND SUMMARY OF THE INVENTION

It is therefore an object of the invention to provide a semiconductor laser precisely controllable in horizontal radiation angle of laser light by minimizing changes in device characteristics with fluctuations of structural parameters of the semiconductor laser, and an optical pickup device and an optical record and/or reproducing apparatus using such a semiconductor laser as a light source.

According to a first aspect of the invention, there is provided a semiconductor laser comprising: a substrate, a first cladding layer on the substrate, an active layer on the first cladding layer, and a second cladding layer on the active layer; and the second cladding layer having a plurality of steps of equivalent complex index of refraction disposed to be parallel to p-n junction direction and to be perpendicular to a cavity direction.

According to a second aspect of the invention, there is provided an optical pickup device using a semiconductor laser as a light source thereof, wherein the semiconductor laser comprising: a substrate, a first cladding layer on the substrate, an active layer on the first cladding layer, a second cladding layer on the active layer; and the second cladding layer having a plurality of steps of equivalent complex index of refraction disposed to be parallel to p-n junction direction and to be perpendicular to a cavity direction.

According to a third aspect of the invention, there is provided an optical record and/or reproducing apparatus using semiconductor laser as a light source thereof, wherein the semiconductor laser comprising: a substrate, a first cladding layer on the substrate, an active layer on the first cladding layer, a second cladding layer on the active layer; and the second cladding layer having a plurality of steps of equivalent complex index of refraction disposed to be parallel to p-n junction direction and to be perpendicular to a cavity direction.

The optical record and/or reproducing apparatus may be a apparatus for both recording and reproduction, for reproduction only, or for recording only.

In any of the above aspects of the invention shown above, since the second cladding layer has a plurality of steps of equivalent complex index of refraction disposed to be parallel to p-n junction direction and to be perpendicular to a cavity direction, the semiconductor laser can better control horizontal radiation angle of laser light than conventional real index-guide semiconductor lasers having a single equivalent refractive index step.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1A:
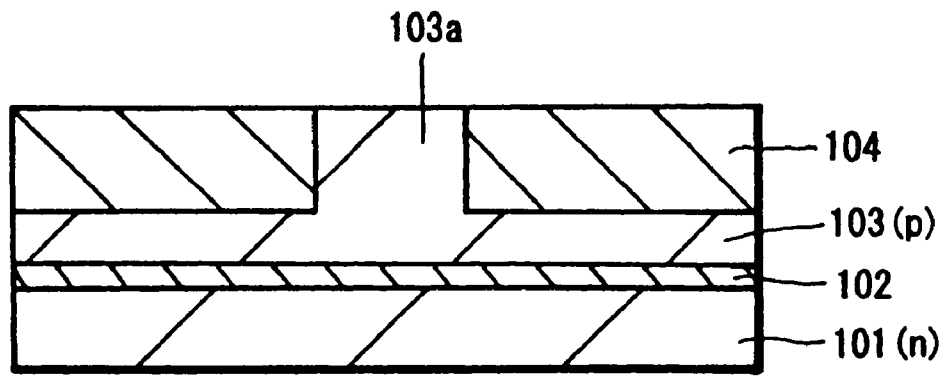
FIGS. 1A and 1B are cross-sectional views of a conventional real index-guide semiconductor laser, and a schematic diagram showing its equivalent complex refractive index distribution.

Embodiments of the invention are explained below with reference to the drawings. Identical or equivalent elements or parts are labelled with common reference numerals in FIGS. 2A to 7B showing embodiments.

Figure 2A:
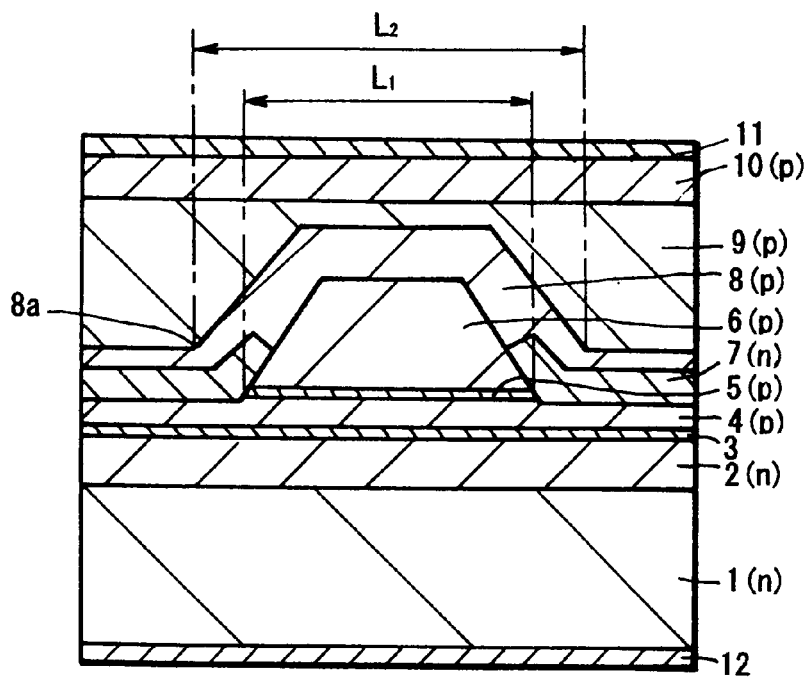
FIGS. 2A and 2B are cross-sectional views of an AlGaAs-based ridge-buried semiconductor laser according to a first embodiment of the invention, and a schematic diagram showing its equivalent complex refractive index distribution.

FIG. 2A shows a ridge-buried semiconductor laser according to a first embodiment of the invention, taking an AlGaAs-based ridge-buried semiconductor laser. As shown in FIG. 2A, the semiconductor laser includes an n-type GaAs substrate 1 on which an n-type $Al_{0.5}Ga_{0.5}As$ cladding layer 2, $Al_{0.12}Ga_{0.88}As$ active layer 3, p-type $Al_{0.5}Ga_{0.5}As$ cladding layer 4, p-type $Al_{0.3}Ga_{0.7}As$ optical guide layer 5 and p-type $Al_{0.5}Ga_{0.5}As$ cladding layer 6 are stacked sequentially. The upper-most portion of the p-type $Al_{0.5}Ga_{0.5}As$ cladding layer 4, p-type $Al_{0.3}Ga_{0.7}As$ optical guide layer 5 and p-type $Al_{0.5}Ga_{0.5}As$ cladding layer 6 has a shape of a stripe of a given width extending in one direction. The extending direction of the stripe portion corresponds to the cavity-lengthwise direction of the semiconductor laser. In opposite sides of the ridge stripe portion, n-type $Al_{0.5}Ga_{0.5}As$ current blocking layers 7 are provided to form a current blocking structure.

A p-type $Al_{0.5}Ga_{0.5}As$ cladding layer 8 overlies the p-type $Al_{0.5}Ga_{0.5}As$ cladding layer 6 and the n-type $Al_{0.5}Ga_{0.5}As$ current blocking layers 7. Sequentially stacked on the p-type $Al_{0.5}Ga_{0.5}As$ cladding layer 8 are a p-type $Al_{0.6}Ga_{0.4}As$ cladding layer 9 and a p-type GaAs contact layer 10. The p-type $Al_{0.6}Ga_{0.4}As$ cladding layer 9 has a substantially flat upper surface. Formed on the p-type GaAs contact layer 10 is a p-side electrode 11 such as Ti/Pt/Au electrode. Formed on the bottom surface of the n-type GaAs substrate 1 is an n-side electrode 12 such as AuGe/Ni/Au electrode.

In the semiconductor laser, the p-type $Al_{0.5}Ga_{0.5}As$ cladding layers 4, 6, 8 and the n-type $Al_{0.5}Ga_{0.5}As$ current blocking layers 7 have substantially equal refractive indices. The p-type $Al_{0.3}Ga_{0.7}As$ optical guide layer 5 has a higher refractive index than those of the p-type $Al_{0.5}Ga_{0.5}As$ cladding layers 4, 6, 8 and the n-type $Al_{0.5}Ga_{0.5}As$ current blocking layers 7. The p-type $Al_{0.6}Ga_{0.4}As$ cladding layer 9 has a lower refractive index than those of the p-type $Al_{0.5}Ga_{0.5}As$ cladding layers 4, 6, 8 and the n-type $Al_{0.5}Ga_{0.5}As$ current blocking layers 7.

Figure 1B:
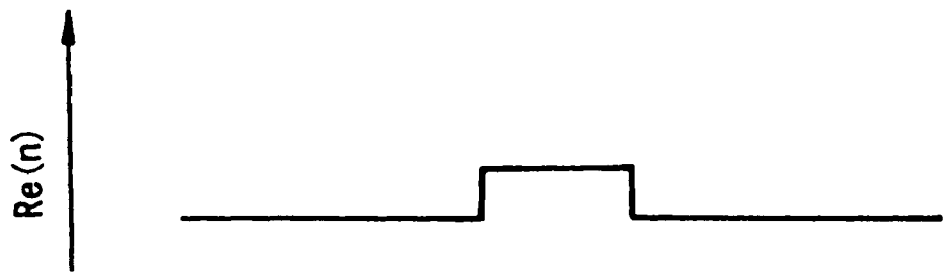

The thickness of the p-type $Al_{0.5}Ga_{0.5}As$ cladding layer 4 in the stripe portion is chosen to approximately 0.3 to 0.5 $\mu$m, for example. The thickness of the p-type $Al_{0.3}Ga_{0.7}As$ optical guide layer 5 is chosen to 50 to 100 nm, for example. The total thickness of the n-type $Al_{0.5}Ga_{0.5}As$ current blocking layers 7 and the p-type $Al_{0.5}Ga_{0.5}As$ cladding layer 8 is chosen to 0.3 to 0.5 $\mu$m, for example. In FIG. 1, $L_1$ is the width of the p-type $Al_{0.3}Ga_{0.7}As$ optical guide layer 5. In this case, $L_1$ is substantially equal to the stripe width of the semiconductor laser. $L_2$ is the width between bottoms 8a of the step appearing on the upper surface of the p-type $Al_{0.5}Ga_{0.5}As$ cladding layer 8. In this case, $L_1$ is chosen to 2.5 to 3.5 $\mu$m, for example, and $L_2$ to 2.7 to 4.5 $\mu$m, for example.

Figure 2B:
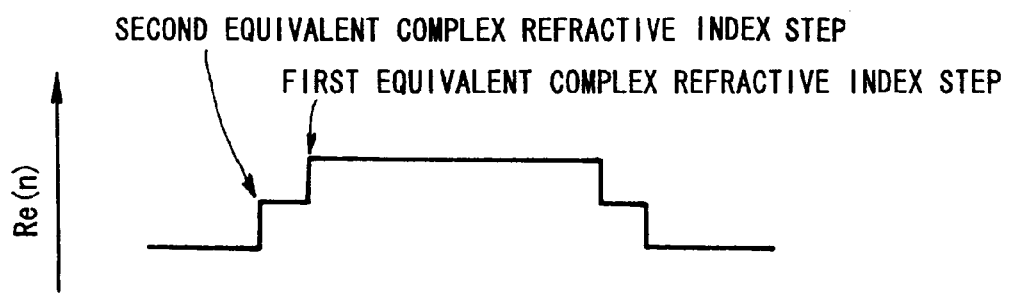

FIG. 2B shows equivalent complex refractive index distribution of the semiconductor laser. Here, the equivalent complex refractive index means a single refractive index in the direction parallel to the p-n junction and perpendicular to the cavity-lengthwise direction obtained by taking weighted mean of refractive index according to light intensity distribution. Here is shown distribution of real parts (Re(n)) (refractive coefficient) of equivalent complex refractive index (n) in the direction parallel to the p-n junction between the n-type $Al_{0.5}Ga_{0.5}As$ cladding layer 2, $Al_{0.12}Ga_{0.88}As$ active layer 3 and p-type $Al_{0.5}Ga_{0.5}As$ cladding layer 4 and perpendicular to the cavity-lengthwise direction, in alignment with FIG. 2A.

As shown in FIG. 2B, the semiconductor laser has two equivalent complex refractive index steps in the direction parallel to the p-n junction and perpendicular to the cavity-lengthwise direction. These two equivalent complex refractive index steps are called a first equivalent complex refractive index step and a second equivalent complex refractive index step from one nearer to the center of emission. In this case, the distance between the first and second equivalent complex refractive index steps is 0.1 $\mu$m or more, namely 0.3 $\mu$m, for example, so that light can sense the equivalent complex refractive index steps. Moreover, the first and second equivalent complex refractive index steps are made by changes only in the real part of the equivalent complex refractive index. The first equivalent complex refractive index step corresponds to opposite ends of the p-type $Al_{0.3}Ga_{0.7}As$ optical guide layer 5. The second equivalent complex refractive index step corresponds to the bottom 8a of the step appearing on the surface of the p-type $Al_{0.5}Ga_{0.5}As$ cladding layer 8.

Figure 3:
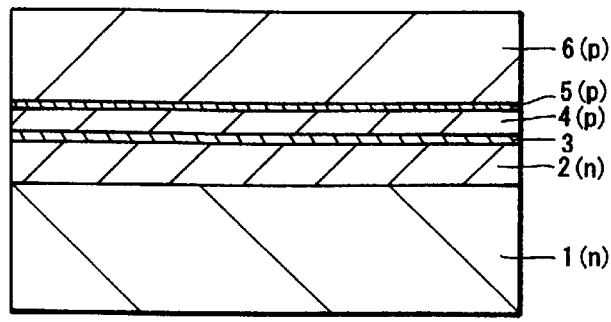
FIG. 3 is a cross-sectional view for explaining a process for manufacturing the AlGaAs-based ridge-buried semiconductor laser according to the first embodiment of the invention.

To fabricate the semiconductor laser having the above construction, as shown in FIG. 3, first stacked on the n-type GaAs substrate 1 are, in sequence, the n-type $Al_{0.5}Ga_{0.5}As$ cladding layer 2, $Al_{0.12}Ga_{0.88}As$ active layer 3, p-type $Al_{0.5}Ga_{0.7}As$ cladding layer 4, p-type $Al_{0.3}Ga_{0.7}As$ optical guide layer 5 and p-type $Al_{0.5}Ga_{0.5}As$ cladding layer 6, by using metal organic chemical vapor deposition (MOVCD), for example.

Figure 4:
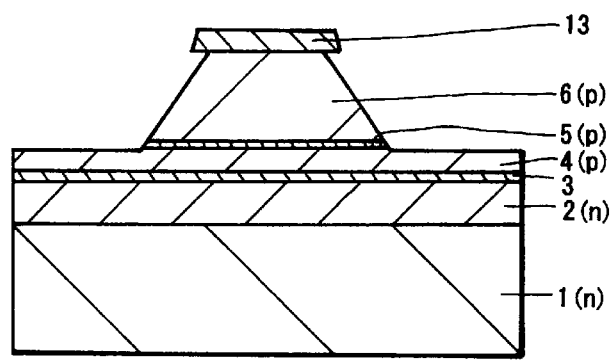
FIG. 4 is a cross-sectional view for explaining a process for manufacturing the AlGaAs-based ridge-buried semiconductor laser according to the first embodiment of the invention.
Figure 5:
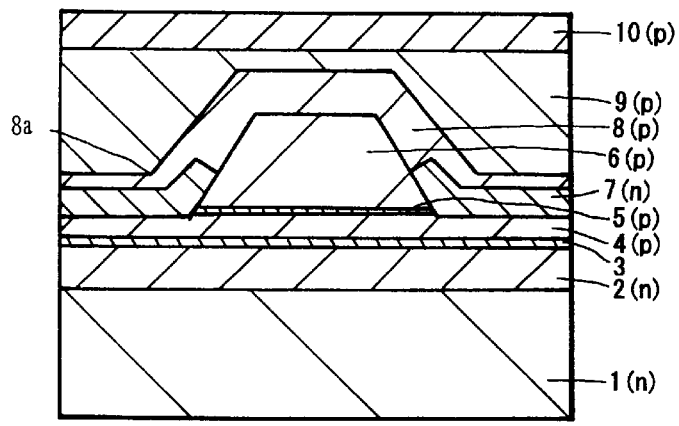
FIG. 5 is a cross-sectional view for explaining a process for manufacturing the AlGaAs-based ridge-buried semiconductor laser according to the first embodiment of the invention.

Next, as shown in FIG. 4, a silicon dioxide ($SiO_2$) film or a silicon nitride ($Si_3N_4$) film is formed on the entire surface of the p-type $Al_{0.5}Ga_{0.5}As$ cladding layer 6 by chemical vapor deposition (CVD), for example, and thereafter patterned by etching to form a stripe-shaped mask 13 of a predetermined width. After that, using the mask 13 as an etching mask, wet etching is applied until reaching the uppermost portion of the p-type $Al_{0.5}Ga_{0.5}As$ cladding layer 4. As a result, the uppermost portion of the p-type $Al_{0.5}Ga_{0.5}As$ cladding layer 4, p-type $Al_{0.3}Ga_{0.7}As$ optical guide layer 5 and the p-type cladding layer 6 are patterned into a stripe of a predetermined width extending in one direction.

After the mask 13 used for etching is removed, the n-type $Al_{0.5}Ga_{0.5}As$ current blocking layer 7 are formed in opposite sides of the stripe portion of the uppermost portion of the p-type $Al_{0.5}Ga_{0.5}As$ cladding layer 4, p-type $Al_{0.3}Ga_{0.7}As$ optical guide layer 5 and the p-type cladding layer 6. After that, the p-type $Al_{0.5}Ga_{0.5}As$ cladding layer 8, p-type $Al_{0.6}Ga_{0.4}As$ cladding layer 9 and p-type GaAs contact layer 10 are sequentially grown on the n-type $Al_{0.5}Ga_{0.5}As$ current blocking layers 7 and the p-type $Al_{0.5}Ga_{0.5}As$ cladding layer 6 by MOCVD, for example.

After that, the p-side electrode 11 is formed on the entire surface of the p-type GaAs contact layer 10, and the n-side electrode 12 is formed on the bottom surface of the n-type GaAs substrate 1, as shown in FIG. 2A.

Thus, the intended semiconductor laser is obtained.

Since the semiconductor laser having the above construction has two equivalent complex refractive index steps in the direction parallel to the p-n junction and perpendicular to the cavity-lengthwise direction, it minimizes the variance in horizontal radiation angle $\theta//$ of laser light due to a variance in stripe width. As a result, the horizontal radiation angle $\theta//$ of laser light can be controlled precisely, and the production yield can be improved significantly. Moreover, since the transverse basic mode of laser oscillation is stabilized, the semiconductor exhibits a high kink level and promises stable behaviors even during emission of a high power.

Next explained is a second embodiment of the invention.

Figure 6A:
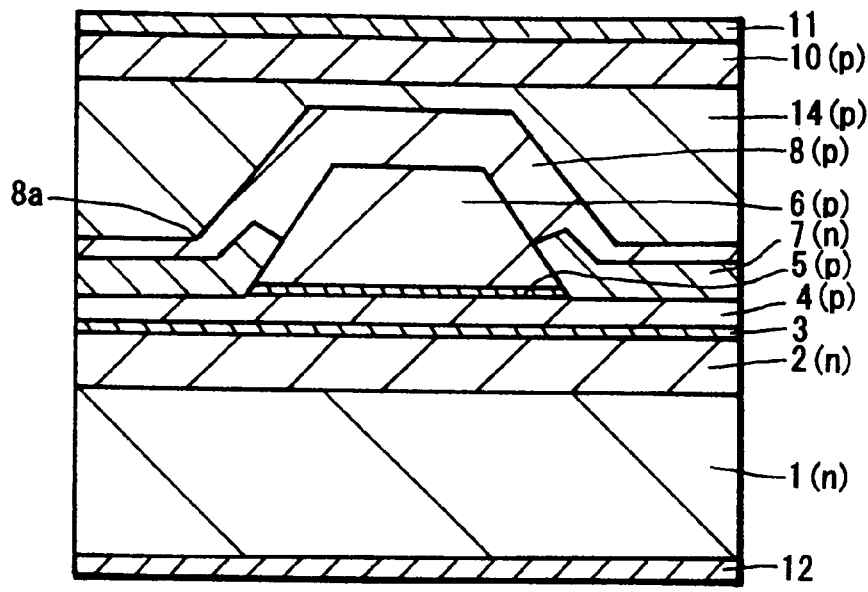
FIGS. 6A and 6B are cross-sectional views of an AlGaAs-based ridge-buried semiconductor laser according to a second embodiment of the invention, and a schematic diagram showing its equivalent complex refractive index distribution.

FIG. 6A shows a semiconductor laser taken as the second embodiment.

In the semiconductor laser, formed on the p-type $Al_{0.5}Ga_{0.5}As$ cladding layer 8 is a p-type GaAs optical guide layer 14 instead of the p-type $Al_{0.6}Ga_{0.4}As$ cladding layer 9. The p-type GaAs optical guide layer 14 has a higher refractive index than those of the p-type $Al_{0.5}Ga_{0.5}As$ cladding layers 4, 6, 8 and n-type $Al_{0.5}Ga_{0.5}As$ current blocking layer 7, and has an absorption coefficient for the wavelength of light from the $Al_{0.12}Ga_{0.88}As$ active layer 3. In the other aspects, the embodiment is the same as the semiconductor laser according to the first embodiment.

Figure 6B:
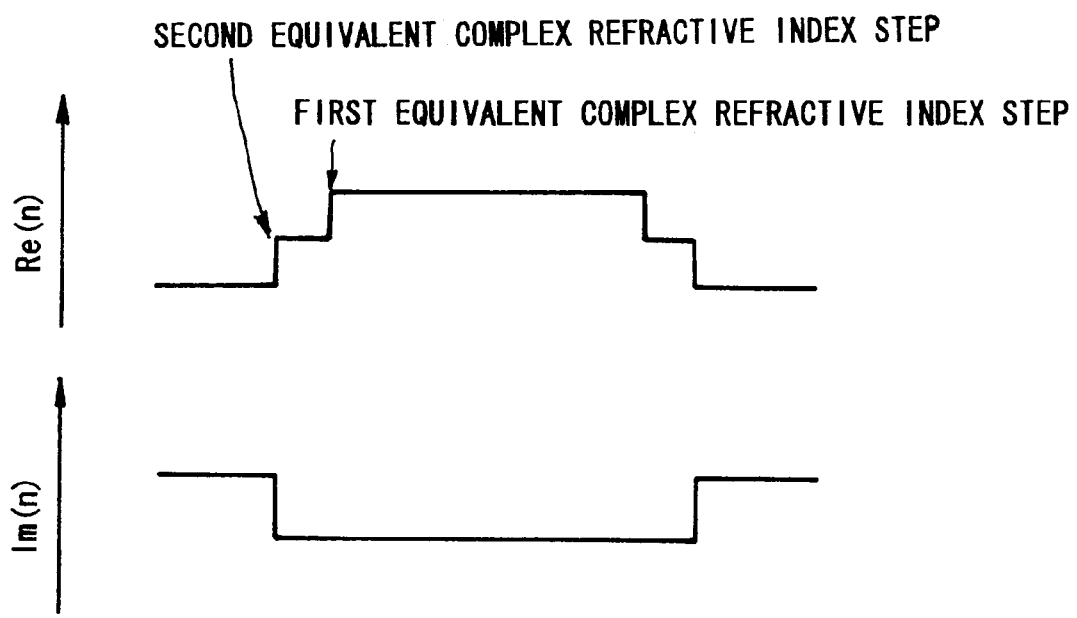

FIG. 6B shows equivalent complex refractive index distribution of the semiconductor laser having the above construction. Here are shown distributions of the real part (Re(n)) and the imaginary part (Im(n)) of equivalent complex refractive index (n) in the direction parallel to the p-n junction between the n-type $Al_{0.5}Ga_{0.5}As$ cladding layer 2, $Al_{0.12}Ga_{0.88}As$ active layer 3 and p-type $Al_{0.5}Ga_{0.5}As$ cladding layer 4 and perpendicular to the cavity-lengthwise direction, in alignment with FIG. 5A.

As shown in FIG. 6B, the semiconductor laser has two equivalent complex refractive index steps in the direction parallel to the p-n junction and perpendicular to the cavity-lengthwise direction. These two equivalent complex refractive index steps are called a first equivalent complex refractive index step and a second equivalent complex refractive index step from one nearer to the emission center. In this case, the distance between the first and second equivalent complex refractive index steps is 0.1 $\mu$m or more, namely 0.3 $\mu$m, for example, so that light can sense the equivalent complex refractive index steps. In this embodiment, the first equivalent complex refractive index step is made by changes only in the real part of the equivalent complex refractive index, and the second equivalent complex refractive index step is made by changes in both the real part and the imaginary part of the equivalent complex refractive index step. The first equivalent complex refractive index step corresponds to opposite ends of the p-type $Al_{0.3}Ga_{0.7}As$ optical guide layer 5. The second equivalent complex refractive index step corresponds to the bottom 8a of the step appearing on the surface of the p-type $Al_{0.5}Ga_{0.5}As$ cladding layer 8.

The semiconductor laser can be made in substantially the same manufacturing process as that of the semiconductor laser according to the first embodiment.

Also the second embodiment attains the same effects as those of the first embodiment.

Next explained is a third embodiment of the invention.

Figure 7A:
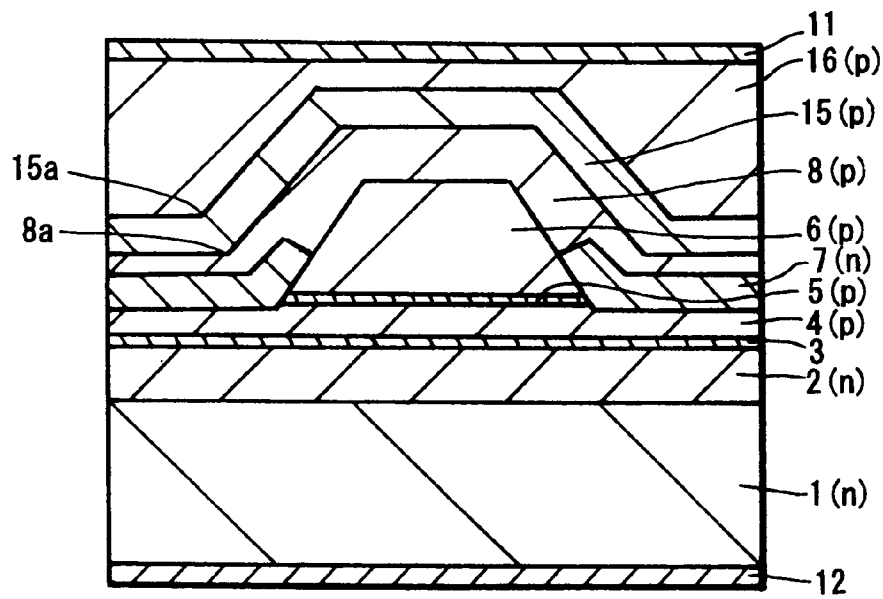
FIGS. 7A and 7B are cross-sectional views of an AlGaAs-based ridge-buried semiconductor laser according to a third embodiment of the invention, and a schematic diagram showing its equivalent complex refractive index distribution.

FIG. 7A shows a semiconductor laser taken as the third embodiment.

In the semiconductor laser, as shown in FIG. 6, stacked on the p-type $Al_{0.5}Ga_{0.5}As$ cladding layer 8 is a p-type $Al_{0.6}Ga_{0.4}As$ optical guide layer 15. Formed on the p-type $Al_{0.6}Ga_{0.4}As$ optical guide layer 15 is a p-type GaAs optical guide and contact layer 16 having a flat upper surface. The p-side electrode 11 is formed on the p-type GaAs optical guide and contact layer 16. The p-type $Al_{0.6}Ga_{0.4}As$ optical guide layer 15 has a lower refractive index than those of the p-type $Al_{0.5}Ga_{0.5}As$ cladding layers 4, 6, 8 and n-type $Al_{0.5}Ga_{0.5}As$ current blocking layers 7. The p-type GaAs optical guide and contact layer 16 has a higher refractive index than the p-type $Al_{0.6}Ga_{0.4}As$ optical guide layer 15, and has an absorption coefficient for the wavelength of light from the $Al_{0.12}Ga_{0.88}As$ active layer 3. In the other aspects, the embodiment is the same as the semiconductor laser according to the first embodiment.

Figure 7B:
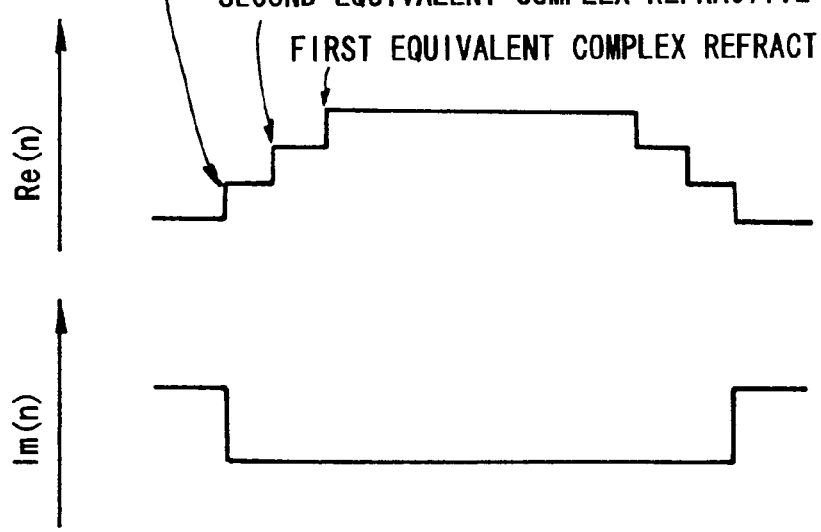

FIG. 7B shows equivalent complex refractive index distribution of the semiconductor laser having the above construction. Here are shown distributions of the real part (Re(n)) and the imaginary part (Im(n)) (extinction coefficient) of equivalent complex refractive index (n) in the direction parallel to the p-n junction between the n-type $Al_{0.5}Ga_{0.5}As$ cladding layer 2, $Al_{0.12}Ga_{0.88}As$ active layer 3 and p-type $Al_{0.5}Ga_{0.5}As$ cladding layer 4 and perpendicular to the cavity-lengthwise direction, in alignment with FIG. 7A.

As shown in FIG. 7B, the semiconductor laser has three equivalent complex refractive index steps in the direction parallel to the p-n junction and perpendicular to the cavity-lengthwise direction. These three equivalent complex refractive index steps are called a first equivalent complex refractive index step, second equivalent complex refractive index step, and third equivalent complex refractive index step from one nearer to the emission center. In this case, the distance between the first and second equivalent complex refractive index steps is 0.1 $\mu$m or more, namely 0.3 $\mu$m, for example, so that light can sense the equivalent complex refractive index steps. The first and second equivalent complex refractive index steps are made by changes only in the real part of the equivalent complex refractive index, and the third equivalent complex refractive index step is made by changes in both the real part and the imaginary part of the equivalent complex refractive index step. The first equivalent complex refractive index step corresponds to opposite ends of the p-type $Al_{0.3}Ga_{0.7}As$ optical guide layer 5. The second equivalent complex refractive index step corresponds to the bottom 8a of the step appearing on the surface of the p-type $Al_{0.5}Ga_{0.5}As$ cladding layer 8. The third equivalent complex refractive index step corresponds to the bottom 15a of the step appearing on the surface of the p-type $Al_{0.6}Ga_{0.4}As$ optical guide layer 15.

The semiconductor laser can be made in substantially the same manufacturing process as that of the semiconductor laser according to the first embodiment.

Also the third embodiment attains the same effects as those of the first embodiment by using three equivalent complex refractive index steps in the direction parallel to the p-n junction and perpendicular to the cavity-lengthwise direction.

Next explained is a fourth embodiment of the invention.

Figure 8:
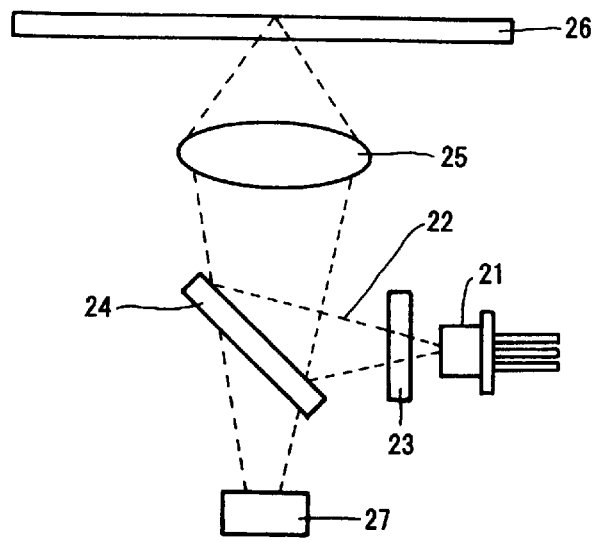
FIG. 8 is a schematic diagram showing an arrangement of an optical pickup device according to a fourth embodiment of the invention.

FIG. 8 is a schematic diagram showing a construction of an optical pickup device taken as the fourth embodiment.

As shown in FIG. 8, the optical pickup device uses a semiconductor laser 21 as its light source. The semiconductor laser 21 is any of semiconductor lasers shown and explained as first to third embodiments of the invention. Laser light 22 emitted from the semiconductor laser 21 enters into a half mirror 24 through a grating 23, and reflected and bent by the half mirror 24 to the direction perpendicular to the direction of incident light. The laser light 22 reflected by the half mirror 24 enters in an optical disc 26 through an objective lens 25. The laser light 22 reflected from the optical disc 26 again passes through the objective lens 25 and the half mirror 24, and enters into a photo diode 27 to be detected as an optical signal there.

Since the optical pickup device according to the fourth embodiment uses one of semiconductor lasers according to the first to third embodiment as its semiconductor laser 21, it minimizes the variance in horizontal radiation angle θ// of laser light. As a result, the horizontal radiation angle θ// of laser light from the semiconductor laser 21 can be controlled precisely, and it is prevented that the light spot expands on the surface of the optical disc 26 due to an excessive variance of the radiation angle θ// beyond the lower limit.

Next explained is a fifth embodiment of the invention.

Figure 9:
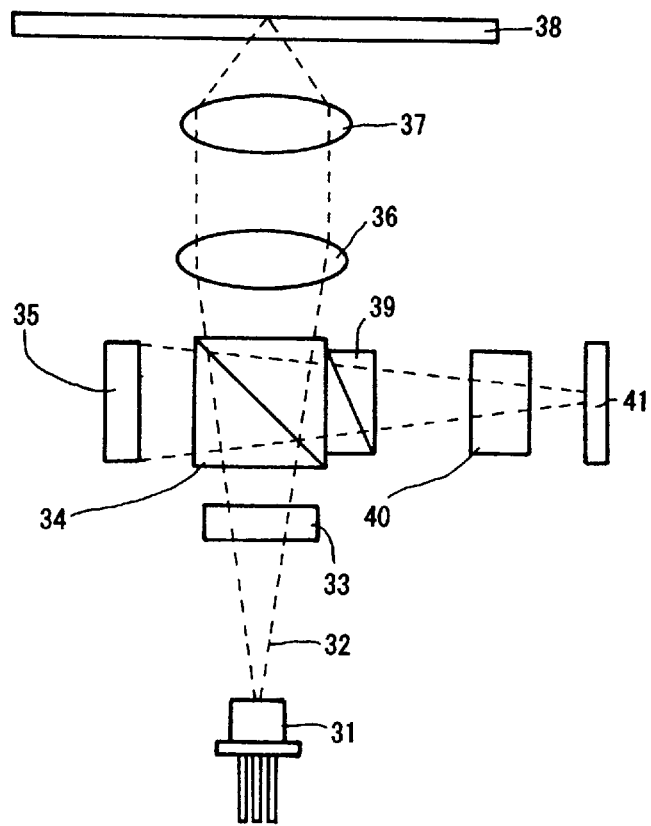
FIG. 9 is a schematic diagram showing an arrangement of a record/reproducing optical system in an optical record/reproducing apparatus according to a fifth embodiment of the invention.

FIG. 9 shows a schematic diagram of an exemplary arrangement of a record/reproducing optical system in a optical record/reproducing apparatus taken as the fifth embodiment.

As shown in FIG. 9, the record/reproducing optical system of the optical record/reproducing apparatus uses a semiconductor laser 31 as its light source. The semiconductor laser 31 is any of semiconductor lasers shown and explained as first to third embodiments of the invention. Laser light 32 emitted from the semiconductor laser 31 enters into a polarizing beam splitter 34 through a grating 33. Part of the laser light 32 introduced to the polarizing beam splitter 34 is bent by the polarizing beam splitter 34 vertically from the direction of the incident light, and introduced to a monitoring photo diode 35. The other part of the laser light 32 passes through the polarizing beam splitter 34 and enters in the magneto-optic disc 38 via a collimator lens 36 and an objective lens 37. Laser light 32 reflected by the magneto-optic disc here again enters in the polarizing beam splitter 34 through the objective lens 37 and the collimator lens 36. Laser light 32 introduced to the polarizing beam splitter 34 is bent vertically of the direction of the incident light by the polarizing beam splitter 34, and enters in a photo diode 41 through a Wollaston polarizing prism 39 and a cylindrical lens 40 to be detected as an optical signal there.

Since the optical pickup device according to the fifth embodiment uses one of semiconductor lasers according to the first to third embodiment as its semiconductor laser 31, it attains the same effects as those of the fourth embodiment. Additionally, it is prevented that a larger recording power is required for recording onto the magneto-optic disc 38, for example, due to an excessive variance of the radiation angle θ// of laser light from the semiconductor laser 31 beyond the lower limit and that the semiconductor laser 31 is evaluated unreliable.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, materials, structures, and so forth, referred to in the embodiments, are only examples, and others may be employed as well. Specifically, the invention is also applicable to semiconductor lasers using other materials, other than AlGaAs-based semiconductor lasers.

Similarly, although specific structures have been explained for the optical pickup device taken as the fourth embodiment and the optical record/reproducing apparatus taken as the fifth embodiment, these devices may have other structures.

The semiconductor lasers according to the first to third embodiments can be used as light sources of phase-variable optical record/reproducing devices other than the optical pickup device and the optical record/reproducing device explained above.

As described above, according to the invention, since the second cladding layer has a plurality of steps of equivalent complex index of refraction disposed to be parallel to p-n junction direction and to be perpendicular to a cavity direction, variance in horizontal radiation angle of laser light caused by variance in structural parameters of the semiconductor laser can be minimized. As a result, it is possible to precisely control the horizontal radiation angle of laser light and to greatly improve the production yield.

What is claimed is:

1. A semiconductor laser with a p-n junction comprising:
    a substrate;
    a first cladding layer on said substrate;
    an active layer on said first cladding layer; and
    a second cladding layer on said active layer, said second cladding layer having a plurality of steps of equivalent complex index of refraction disposed parallel to the p-n junction direction and perpendicular to a cavity-lengthwise direction, said steps comprising first, second and third equivalent complex indices of refraction, said complex indices of refraction being different from one another.

2. The semiconductor laser according to claim 1 wherein said plurality of steps of equivalent complex index of refraction are made by changes only in their refractive coefficient.

3. The semiconductor laser according to claim 1 wherein all of said plurality of steps of equivalent complex index of refraction are accompanied by changes in their refractive coefficients, and at least one of said plurality of steps of equivalent complex index of refraction is accompanied by changes in its extinction coefficient.

4. The semiconductor laser according to claim 1 wherein said plurality of steps of equivalent complex index of refraction includes first and second steps of equivalent complex index of refraction and the distance between the first step of equivalent complex index of refraction and the second step of equivalent complex index of refraction is not less than 0.1 μm.

5. The semiconductor laser according to claim 1 wherein the values of said plurality of steps of equivalent complex index of refraction increase toward the center of emission.

6. An optical pickup device using a semiconductor laser with a p-n junction as a light source thereof, wherein said semiconductor laser comprising:
    a substrate;
    a first cladding layer on said substrate;

an active layer on said first cladding layer; and a second cladding layer on said active layer, said second cladding layer having a plurality of symmetrically disposed steps of equivalent complex index of refraction disposed parallel to the p-n junction direction and perpendicular to a cavity-lengthwise direction.

7. An optical record and/or reproducing apparatus using semiconductor laser with a p-n junction as a light source thereof, wherein said semiconductor laser comprising:

a substrate;

a first cladding layer on said substrate; an active layer on said first cladding layer; and a second cladding layer on said active layer, said second cladding layer having a plurality of symmetrical steps of equivalent complex index of refraction disposed to be parallel to the p-n junction direction and to be perpendicular to a cavity-lengthwise direction.

* * * * *